United States Patent
Chou et al.

(10) Patent No.: US 9,093,459 B2
(45) Date of Patent: Jul. 28, 2015

(54) PACKAGE STRUCTURE HAVING A SEMICONDUCTOR COMPONENT EMBEDDED THEREIN AND METHOD OF FABRICATING THE SAME

(75) Inventors: Pao-Hung Chou, Taoyuan (TW); Chih-Hao Hsu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 587 days.

(21) Appl. No.: 13/207,756

(22) Filed: Aug. 11, 2011

(65) Prior Publication Data

US 2012/0120609 A1 May 17, 2012

(30) Foreign Application Priority Data

Nov. 12, 2010 (TW) ............................... 099139081 A

(51) Int. Cl.
| | | |
|---|---|---|
| H01L 21/00 | (2006.01) | |
| H01L 21/56 | (2006.01) | |
| H01L 21/683 | (2006.01) | |
| H01L 23/00 | (2006.01) | |
| H01L 23/31 | (2006.01) | |

(52) U.S. Cl.
CPC .......... *H01L 21/568* (2013.01); *H01L 21/6835* (2013.01); *H01L 24/19* (2013.01); *H01L 24/20* (2013.01); *H01L 23/3128* (2013.01); *H01L 2221/68372* (2013.01); *H01L 2224/24227* (2013.01); *H01L 2224/92244* (2013.01); *H01L 2924/014* (2013.01); *H01L 2924/01029* (2013.01); *H01L 2924/01033* (2013.01); *H01L 2924/01079* (2013.01); *H01L 2924/1517* (2013.01); *H01L 2924/15153* (2013.01)

(58) Field of Classification Search
CPC .......................... H05K 7/2039–7/20518; H01L 23/34–23/4735
USPC ....................... 361/679.46–679.54, 688–723, 361/761–764; 165/80.2; 257/712–713, 720, 257/675; 174/252, 260
See application file for complete search history.

(56) References Cited

U.S. PATENT DOCUMENTS

| | | | | |
|---|---|---|---|---|
| 5,835,355 | A | * | 11/1998 | Dordi ............................ 361/760 |
| 6,297,964 | B1 | * | 10/2001 | Hashimoto ................... 361/760 |
| 6,809,931 | B2 | * | 10/2004 | Dove et al. .................... 361/707 |

(Continued)

FOREIGN PATENT DOCUMENTS

| | | |
|---|---|---|
| TW | 200638499 | 11/2006 |
| TW | 201019435 | 5/2010 |
| TW | 201039415 | 11/2010 |

*Primary Examiner* — Zachary M Pape
(74) *Attorney, Agent, or Firm* — Mintz Levin Cohn Ferris Glovsky and Popeo, P.C.; Peter F. Corless; Steven M. Jensen

(57) ABSTRACT

A package structure includes: a first dielectric layer having a first surface and a second surface opposing the first surface; a semiconductor chip embedded in the first dielectric layer in a manner that the semiconductor chip protrudes from the second surface, and having an active surface and an inactive surface opposing the active surface, electrode pads being disposed on the active surface and in the first dielectric layer, the inactive surface and a part of a side surface adjacent the inactive surface protruding from the second surface; a first circuit layer disposed on the first surface; a built-up structure disposed on the first surface and the first circuit layer; and an insulating protective layer disposed on the built-up structure, a plurality of cavities being formed in the insulating protective layer for exposing a part of a surface of the built-up structure. The package structure includes only one built-up structure.

10 Claims, 3 Drawing Sheets

(56) References Cited

U.S. PATENT DOCUMENTS 7,508,066 B2 * 3/2009 Huang et al. .................. 257/707
2008/0277150 A1 * 11/2008 Takashima et al. ........... 174/260
2009/0301767 A1 * 12/2009 Mok et al. ..................... 174/255
2009/0321118 A1 * 12/2009 Kim et al. ..................... 174/260

* cited by examiner

PACKAGE STRUCTURE HAVING A SEMICONDUCTOR COMPONENT EMBEDDED THEREIN AND METHOD OF FABRICATING THE SAME

CROSS-REFERENCES TO RELATED APPLICATIONS

This application claims under 35 U.S.C. §119(a) the benefit of Taiwanese Application No. 099139081, filed Nov. 12, 2010, the entire contents of which is incorporated herein by reference.

BACKGROUND OF THE INVENTION

1. Field of the Invention

This invention relates to package structures and method of fabricating the same, and, more particularly, to a package structure having a semiconductor component embedded therein and a method of fabricating the same.

2. Description of Related Art

With the rapid development of semiconductor package technology, modern semiconductor devices may have various package types. In a semiconductor device, a chip is installed on and electrically connected to a packaging substrate, and is encapsulated with an encapsulant. In order to reduce the height of the package, the chip may be embedded in the packaging substrate. Such a package not only has a reduced size, but also can improve the electrical functionality thereof.

Referring to FIGS. 1A to 1E, which are cross-sectional views illustrating a method of fabricating a package structure having a semiconductor component embedded therein according to the prior art.

As shown in FIG. 1A, a core board 10 is provided with an opening 100 that penetrates the core board 10. Interlayer circuits 101 are formed on top and bottom sides of the core board 10. Conductive through holes 102 are formed in and penetrate the core board 10. The conductive through holes 102 electrically connect the interlayer circuits 101.

As shown in FIG. 1B, a carrier board 14 having a dielectric material 120a is disposed on a bottom side of the core board 10, and a semiconductor chip 11 having a plurality of electrode pads 100 is received in the opening 100 and is disposed on the dielectric material 120a by an adhesive layer 11a.

As shown in FIG. 1C, another dielectric material 120b is compressed on a top side of the core board 10 and the semiconductor chip 11, such that the two dielectric materials 120a and 120b form the dielectric layer 12. The dielectric layer 12 is filled in an interval between an opening wall of the opening 100 and the semiconductor chip 11, in order to fix the semiconductor chip 11 in the opening 100. Then, the carrier board 14 is removed.

As shown in FIG. 1D, circuit layers 13 are formed on top and bottom sides of the dielectric layer 12. The circuit layers 13 have conductive vias 130 that are formed in the dielectric layer 12 for electrically connecting to the electrode pads 110 to the interlayer circuits 101. Conductive pads 130a are formed on the top one of the circuit layers 13, and ball-implanting pads 130b are formed on the bottom one of the circuit layers 13.

As shown in FIG. 1E, solder mask layers 15 are formed on the dielectric layer 12 and the circuit layers 13. Cavities 150 are formed in the solder mask layers 15 for exposing the conductive pads 130a and the ball-implanting pads 130b.

In the prior art, the dielectric layer 12 on two sides of the core board 10 have to be compressed towards the semiconductor chip 12 received in the opening 100 of the core board 10, whereby the semiconductor chip 12 is easily displaced. As shown in FIG. 1C, the left and right intervals between the semiconductor chip 11 and the opening wall of the opening 100 are denoted by t and s, respectively, wherein t<s, and the semiconductor chip 11 has a shaping offset approximately equal to +/−100 μm. In other words, it is hard to locate the semiconductor chip 11 in the opening 100 precisely as desired. As the semiconductor chip 11 is displaced, the electrode pads 110 of the semiconductor chip 11 may not be electrically connected to the conductive vias 130 exactly, as shown in FIG. 1D. Therefore, the package structure may suffer from poor electrical connection quality and low product yield.

Moreover, no heat-dissipating structure is embedded in the opening 100 of the core board 10, so the heat generated by the semiconductor chip 11 embedded in the opening 100 of the core board 10, is inefficiently dissipated. As a result, the semiconductor chip 11 may likely malfunction.

Moreover, the semiconductor chip 11 has to be embedded in the core board 10, which is thicker than the semiconductor chip 11. Accordingly, the thickness of the overall structure is increased significantly due to the core board 10, whereby making the final product fail to meet the low-profile and compact-size requirements for electronic components.

No circuit may be formed on two sides of the core board 10, unless conductive through holes 102 are formed to electrically connect the interlayer circuits 101 and the circuit layers 13 on two sides of the core board 10. Such a package structure is difficult to be fabricated, and has a high cost for fabrication.

Therefore, how to overcome the drawbacks of the prior art is becoming one of the most critical issues in the art.

SUMMARY OF THE INVENTION

In view of the above-mentioned problems of the prior art, an embodiment of the present invention provides a package structure having a semiconductor component embedded therein and a method of fabricating the same with a better alignment.

Another embodiment of the present invention provides a package structure having a semiconductor component embedded therein and a method of fabricating the same with a improved heat-dissipating capability.

Another embodiment of the present invention provides a package structure having a semiconductor component embedded therein and a method of fabricating the same with a thinned capacity.

Yet another embodiment of the present invention provides a package structure having a semiconductor component embedded therein and a method of fabricating the same with a reduced cost.

In order to accomplish the above and other embodiments, an embodiment of the present invention provides a package structure having a semiconductor component embedded therein, including: a first dielectric layer having a first surface and a second surface opposing the first surface; a semiconductor chip embedded in the first dielectric layer in a manner that the semiconductor chip protrudes from the second surface of the first dielectric layer, and having an active surface and an inactive surface opposing the active surface, wherein electrode pads are formed on the active surface and in the first dielectric layer, the inactive surface and a part of a side surface adjacent the inactive surface are protruded and from the second surface of the first dielectric layer; a first circuit layer formed on the first surface of the first dielectric layer, a plurality of first conductive vias being formed in the first dielectric layer and electrically connected to the first circuit layer and the electrode pads; a built-up structure formed on the first surface of the first dielectric layer and the first circuit layer; and an insulating protective layer formed on the built-up structure, with a plurality of through holes being formed in the insulating protective layer for exposing a part of the built-up structure.

In an embodiment of the present invention, the package structure further includes a metal layer formed on the second surface of the dielectric layer, the metal layer having an opening for the semiconductor chip to be disposed therein and used as a heat-dissipating component; the package structure further includes a carrier layer formed on the metal layer and the inactive surface of the semiconductor chip and used as another heat-dissipating component; and the carrier layer is made of copper.

In an embodiment of the present invention, the built-up structure comprises at least a second dielectric layer, a second circuit layer on the second dielectric layer, and a plurality of second conductive vias formed in the second dielectric layer and electrically connected to the first and second circuit layers, allowing a part of the second circuit layer to be exposed from the through holes.

In an embodiment of the present invention, the package structure further includes a surface treatment layer formed on the exposed surface of the built-up structure in the through holes, and the surface treatment layer is made of a material selected from the group consisting of electroplated nickel/gold, electroless nickel/gold, electroless nickel immersion gold (ENIG), electroless nickel electroless palladium immersion gold (ENEPIG), immersion tin, and organic solderability preservative (OSP).

An embodiment of the present invention further provides a method of fabricating a package structure having a semiconductor component embedded therein, comprising: providing a core board having two opposing surfaces on which two carrier layers are formed; forming on the carrier layers two metal layers having openings for exposing a part of the carrier layers; disposing on the carrier layers in the openings semiconductor chips each having an active surface and an inactive surface opposing the active surface, wherein a plurality of electrode pads are formed on the active surface of each of the semiconductor chips, and the semiconductor chips are mounted on the carrier layers in the openings via the inactive surfaces thereof; forming on the metal layers and the semiconductor chips first dielectric layers that have exposed first surfaces and second surfaces attached to the metal layers; forming first circuit layers on the first surfaces of the first dielectric layers, and forming in the first dielectric layers a plurality of first conductive vias for being electrically connected to the first circuit layers and the electrode pads; forming built-up structures on the first surfaces of the first dielectric layers and the first circuit layers; forming insulating protective layers on the built-up structures, and forming in the insulating protective layers a plurality of through holes for exposing a part of the built-up structures; and removing the core board, so as to expose the carrier layers.

In an embodiment of the present invention, release layers are formed between the two surfaces of the core board and the carrier layers, such that the core board is removed by means of the release layers.

In an embodiment of the present invention, the carrier layers are made of copper.

In an embodiment of the present invention, the metal layers are formed by forming resist layers on the carrier layers, and forming opening areas on the resist layers for exposing the part of the carrier layers; forming the metal layers on the carrier layers within the opening areas; and removing the resist layers to form the openings.

In an embodiment of the present invention, each of the built-up structures comprises at least a second dielectric layer, a second circuit layer formed on the second dielectric layer, and a plurality of second conductive vias formed in the second dielectric layer and electrically connected to the first and second circuit layers, such that a part of the second circuit layer of the built-up structure is exposed from the through holes.

In an embodiment of the present invention, after the core board is removed, the carrier layers and the metal layers are used as heat-dissipating components.

In an embodiment of the present invention, the method further includes, after the core board is removed, removing the carrier layers and the metal layers to expose the second surfaces of the dielectric layers, with the inactive surfaces and a part of side surfaces adjacent to the inactive surfaces protruded from the second surfaces of the dielectric layers.

In an embodiment of the present invention, the method further includes forming surface treatment layers on the exposed parts of the built-up structures in the through holes, and each of the surface treatment layers is made of a material selected from the group consisting of electroplated nickel/gold, electroless nickel/gold, electroless nickel immersion gold (ENIG), electroless nickel electroless palladium immersion gold (ENEPIG), immersion tin, and organic solderability preservative (OSP).

In the package structure having the semiconductor component embedded therein and the method of fabricating the same according to the present invention, the alignment precision is improved, through the installation of the semiconductor chip on the carrier layer. Through the removal of the core board and the formation of the built-up structure on only one surface of each of the first dielectric layers, the overall structure has a reduced thickness, and thereby achieves the thinning objective. In addition, since the process of fabricating the conductive through holes that penetrate two sides of the overall structure needs not to be performed, the fabrication process of the present invention is simplified and the cost therefore is reduced. Moreover, the semiconductor chip protrudes from the dielectric layer and is attached to the metal layer such that the heat-dissipating capability of the semiconductor chip is enhanced, and the semiconductor chip is prevented from being damaged due to overheating.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Referring to FIGS. 2A to 2E, cross-sectional views illustrating a method of fabricating a package structure having a semiconductor component embedded therein according to the present invention are shown.

Figure 1A:
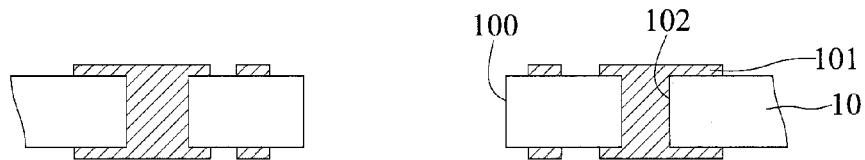
FIGS. 1A to 1E are cross-sectional views illustrating a method of fabricating a package structure having a semiconductor component embedded therein according to the prior art.
Figure 1B:
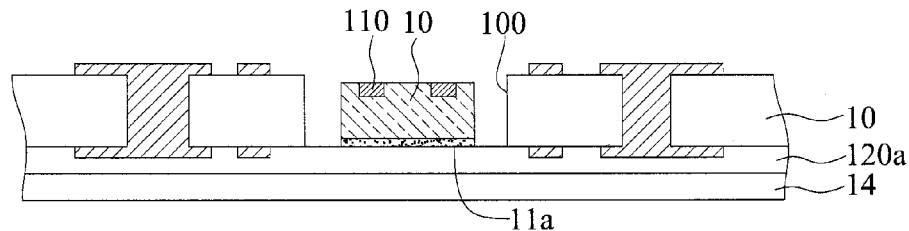
Figure 1C:
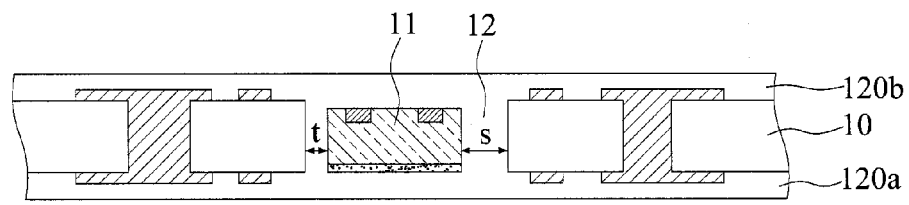
Figure 1D:
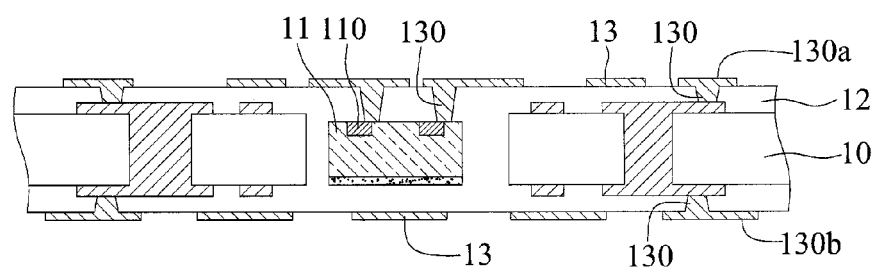
Figure 1E:
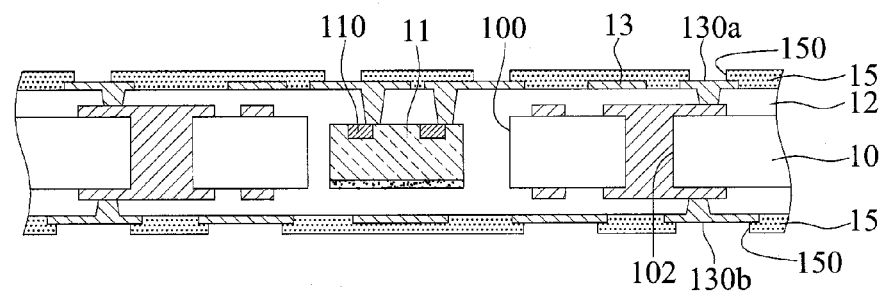
Figure 2A:
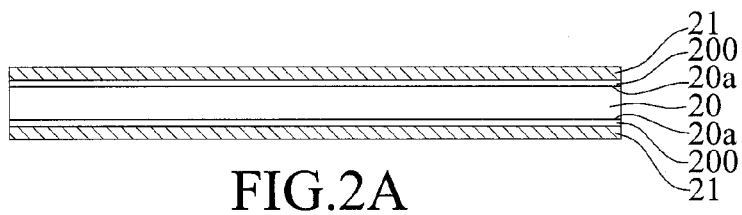
FIGS. 2A to 2H are cross-sectional views illustrating a method of fabricating a package structure having a semiconductor component embedded therein according to the present invention, wherein FIG. 2H' is another embodiment of FIG. 2H.

As shown in FIG. 2A, a core board 20 is provided that has two opposing surfaces 20a. A release layer 200 and a carrier layer 21 made of copper are formed sequentially on each of the surfaces 20a of the core board 20.

Figure 2B:
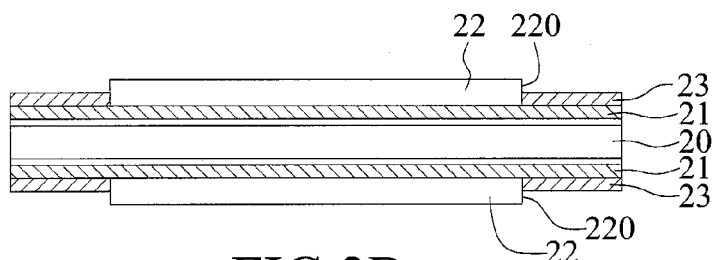

As shown in FIG. 2B, a resist layer 22 is formed on each of the carrier layers 21, and then the resist layer 22 is exposed and developed to form an opening area 220, from which a part of the carrier layer 21 is exposed. Then, the carrier layer 21 is electroplated to form thereon a metal layer 23 that is also made of copper.

Figure 2C:
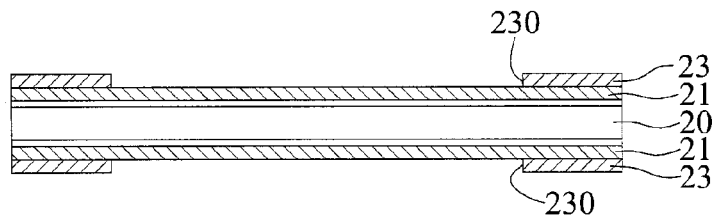

As shown in FIG. 2C, the resist layer 22 is removed to form an opening 230 in the metal layer 23, from which the part of the carrier layer 21 is exposed. In an embodiment of the present invention, the part of the carrier layer 21 exposed from the opening 230 is defined as a chip mounting area.

Figure 2D:
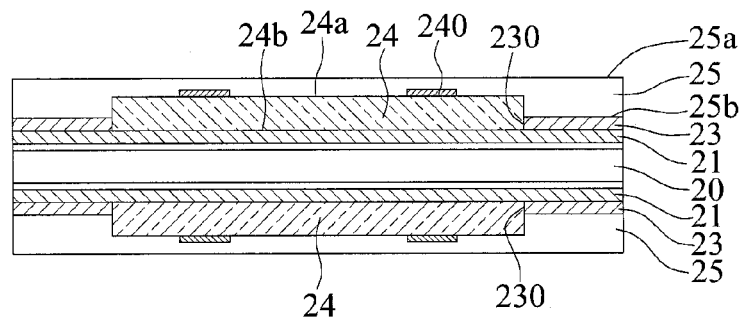

As shown in FIG. 2D, a semiconductor chip 24 is mounted on the part of the carrier layer 21 exposed from the opening 230. The semiconductor chip 24 has an active surface 24a and an inactive surface 24b opposing the active surface 24a. Electrode pads are formed on the active surface 24a. The semiconductor chip 24 is mounted on the part of the carrier layer 21 exposed from the opening 230 via the inactive surface 24b thereof. Through the exposure and development processes performed on the resist layer 22, the semiconductor chip 24 has a location precision equivalent to an exposure alignment precision. Therefore, the alignment precision (the shaping offset is approximately equal to +/−10 µm) is increased significantly, as compared with the method according to the prior art.

Then, a first dielectric layer 25 is formed on the metal layer 23 and the semiconductor chip 24. The first dielectric layer 25 has an exposed first surface 25a and a second surface 25b which is attached to the metal layer 23.

Figure 2E:
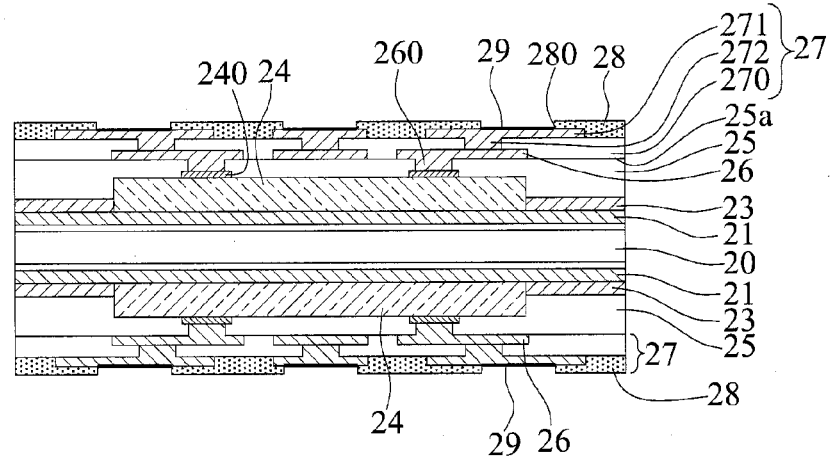

As shown in FIG. 2E, a first circuit layer 26 is formed on the first surface 25a of the first dielectric layer 25, and a plurality of first conductive vias 260 electrically connected to the first circuit layer 26 and the electrode pads 240 are formed in the first dielectric layer 25. In an embodiment of the present invention, the first dielectric layer 25 has a thickness that is adjustable according to a radius of a laser drill for forming the first conductive vias 260 in the first dielectric layer 25.

Afterwards, a built-up structure 27 is formed on the first surface 25a of the first dielectric layer 25 and the first circuit layer 26. The built-up structure 27 has at least a second dielectric layer 270, a second circuit layer 271 formed on the second dielectric layer 270, and a plurality of second conductive vias 272 formed in the second dielectric layer 270 for being electrically connected to the first circuit layer 26 and the second circuit layer 271.

An insulating protective layer 28 is then formed on the built-up structure 27. A plurality of through holes 280 are formed in the insulating protective layer 28, for exposing a part of the second circuit layer 271 of the built-up structure 27.

A surface treatment layer 29 is then formed on the part of the second circuit layer 271 exposed from the through holes 280. In an embodiment of the present invention, the surface treatment layer 29 is made of electroplated nickel/gold, ENIG, ENEPIG, immersion tin or OSP.

Figure 2F:
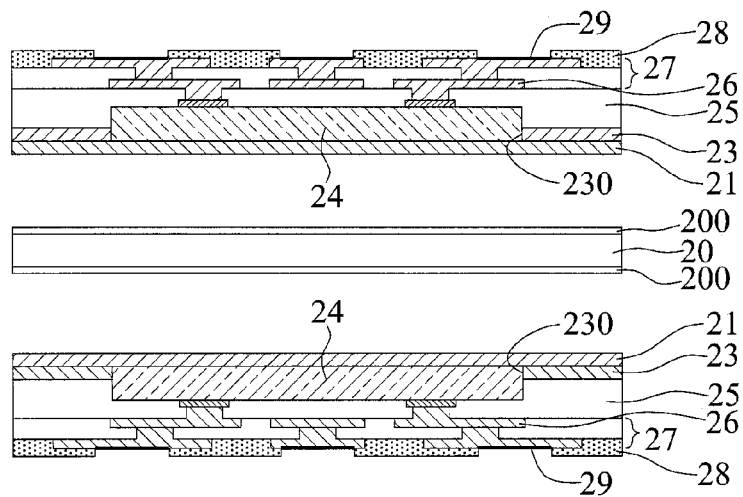

As shown in FIG. 2F, the core board 20 is removed by means of the release layer 20. As a result, a coreless package structure that has no core board is formed. The coreless package structure has a reduced thickness that meets the low-profile and compact-size requirements.

Figure 2G:
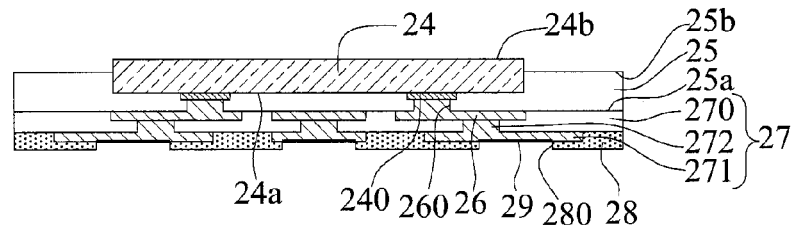

As shown in FIG. 2G, the carrier layer 21 and the metal layer 23 are removed, such that the second surface 25b of the first dielectric layer 25 is exposed, and the inactive surface 24b of the semiconductor chip 24 and a part of a side surface adjacent to the inactive surface 24b are protruded from the second surface 25b of the first dielectric layer 25. Therefore, the heat-dissipating capability is enhanced, and the semiconductor chip 24 can be prevented from being damage due to over-heating.

The electroplated metal layer 23 is equal in height to the semiconductor chip 24 that protrudes from the second surface 25b of the first dielectric layer 25. Therefore, the height of the protrusion can be controlled as desired based on the height of the metal layer 23. The embedding depth of the semiconductor chip 24 can also be controlled, so as to conveniently adjust parameters in the laser drill process performed on the first conductive vias 260.

Figure 2H:
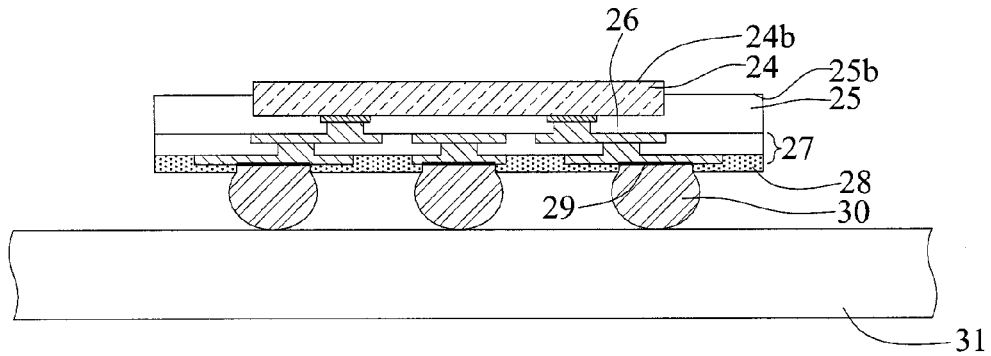
Figure 2H:
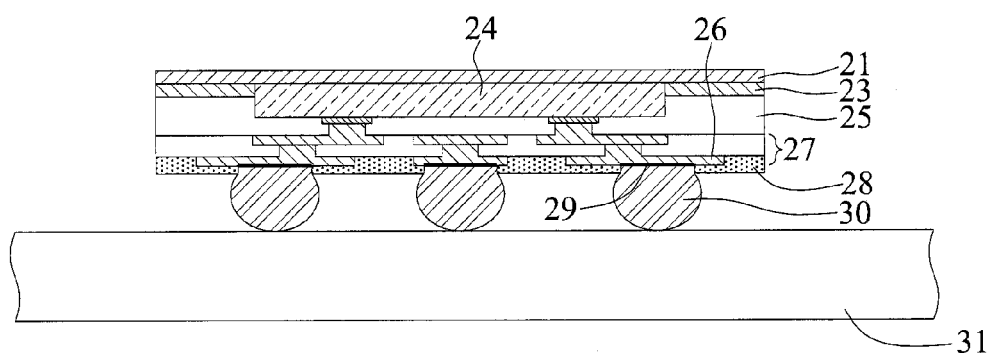

As shown in FIG. 2H, during subsequent processes solder balls 30 are implanted on the exposed part of the second circuit layer 271 of the built-up structure 27. A printed circuit board 31 is then attached to the solder balls 30.

According to the present invention, the resist layer 22 is exposed and developed. As a result, the semiconductor chip 24 has a shaping offset approximately equal to +/−10 which is far smaller than the shaping offset of +/−100 µm in the prior art. Therefore, the precision of the present invention is increased significantly.

The present invention provides a coreless package structure that has no core board. The built-up structure is not formed on the second surface 25b of the first dielectric layer 25, but formed on the first surface 25a of the first dielectric layer 25 only. Therefore, the package structure of the present invention is far thinner than a package structure of the prior art in which built-up structures are formed on both sides of the core board.

The process of fabricating the conductive through holes is not required in the present invention, so the present invention is simple in fabrication process and low in cost.

The semiconductor chip 24 protrudes from the second surface 25b of the first dielectric layer 25. As such, the heat-dissipating capability is enhanced, and the semiconductor chip 24 is prevented from being damaged due to overheating. Therefore, the problem of the prior art is solved that the heat generated by the semiconductor chip can not be dissipated effectively.

FIG. 2H' shows another embodiment of the present invention. After the core board 20 is removed, as shown in FIG. 2F, the carrier layer 21 and the metal layer 23 remain and are used as heat-dissipating components, so as to enhance the heat-dissipating capability and prevent the semiconductor chip 24 from being damaged due to overheating. Then, solder balls 30 are implanted on the exposed part of the second circuit layer 271, and a printed circuit board 31 is attached to the solder balls 30.

The present invention further provides a package structure having a semiconductor component embedded therein, the package structure has a first dielectric layer 25 having a first surface 25a and a second surface 25b opposing the first surface 25a; a semiconductor chip 24 embedded in the first dielectric layer 25 in a manner that the semiconductor chip 24 protrudes from the second surface 25b of the first dielectric layer 25; a first circuit layer 26 formed on the first surface 25a of the first dielectric layer 25; a built-up structure 27 formed on the first surface 25a of the first dielectric layer 25 and the first circuit layer 26; and an insulating protective layer 28 formed on the built-up structure 27.

In an embodiment of the present invention, the semiconductor chip 24 has an active surface 24a and an inactive surface 24b opposing the active surface 24a. A plurality of electrode pads 240 are formed on the active surface 24a and in the first dielectric layer 25, and the inactive surface 24b and a part of a side surface adjacent the inactive surface 24b are protruded from the second surface 25b of the first dielectric layer 25.

In an embodiment of the present invention, the first circuit layer 26 has a plurality of first conductive vias 260 formed in the first dielectric layer 25 and electrically connected to the electrode pads 240.

In an embodiment of the present invention, the built-up structure 27 has at least a second dielectric layer 270, a second circuit layer 271 formed on the second dielectric layer 270, and second conductive vias 272 formed in the second dielectric layer 270 and electrically connected to the first and second circuit layers 26 and 271.

In an embodiment of the present invention, a plurality of through holes 280 are formed in the insulating protective layer 28, for exposing a part of the second circuit layer 271 of the built-up structure 27, and solder balls 30 are disposed on the exposed part of the second circuit layer 271, for a printed circuit board 31 to be mounted thereon.

In an embodiment of the present invention, the package structure further comprises a metal layer 23 formed on the second surface 25 of the first dielectric layer 25. The metal layer 23 has an opening 230 for receiving the semiconductor chip 24 and is used as a heat-dissipating component. The package structure further comprises a carrier layer 21 formed on the metal layer 23 and the inactive surface of the semiconductor chip 24. The carrier layer 21 is also used as a heat-dissipating component. The carrier layer 21 is made of copper.

In an embodiment of the present invention, the package structure further comprises a surface treatment layer 29 formed on the exposed part of the second circuit layer 271 of the built-up structure 27 exposed from the through holes 280, and the surface treatment layer 29 is made of electroplated nickel/gold, ENIG, ENEPIG, immersion tin or OSP.

In a package structure having a semiconductor chip embedded therein and a method of fabricating the same according to the present invention, through the exposure and development processed performed on a resist layer, the semiconductor chip has better shaping offset than the prior art, and the alignment precision is thus enhanced.

Through the removal of the core board, the present invention provides a coreless package structure that has no core board. The built-up structure is formed on one surface of the first dielectric layer only. Therefore, the thickness of the overall structure is reduced significantly, and the package structure can thus meet the low-profile and compact-size requirements.

The built-up structure is formed on one surface of the first dielectric layer only. As such, the process of fabricating the conductive through holes is not required in the present invention, making the present invention simple in fabrication processes and low in cost.

Since the semiconductor chip protrudes from the dielectric layer and is attached to the metal layer, the heat-dissipating capability of the semiconductor chip is enhanced significantly, and the semiconductor chip can thus be prevented from being damaged due to overheating.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A package structure having a semiconductor component embedded therein, comprising:
    a first dielectric layer having a first surface and a second surface opposing the first surface;
    a semiconductor chip embedded in the first dielectric layer in a manner that the semiconductor chip protrudes from the second surface of the first dielectric layer, and having an active surface and an inactive surface opposing the active surface, in which electrode pads are formed on the active surface and in the first dielectric layer, the inactive surface and a part of a side surface adjacent the inactive surface protrude from the second surface of the first dielectric layer and are exposed from the second surface of the first dielectric layer, and the inactive surface is higher than the second surface of the first dielectric layer and exposed to outside;
    a first circuit layer formed on the first surface of the first dielectric layer, with a plurality of first conductive vias formed in the first dielectric layer for electrically connecting to the first circuit layer to the electrode pads;
    a built-up structure formed on the first surface of the first dielectric layer and the first circuit layer; and
    an insulating protective layer formed on the built-up structure, with a plurality of through holes formed in the insulating protective layer for exposing a part of a surface of the built-up structure.

2. The package structure of claim 1, wherein the built-up structure comprises at least a second dielectric layer, a second circuit layer on the second dielectric layer, and a plurality of second conductive vias formed in the second dielectric layer for electrically connecting the first circuit layer to the second circuit layer, and a part of a surface of the second circuit layer is exposed from the through holes.

3. The package structure of claim 1, further comprising a surface treatment layer formed on the exposed part of the built-up structure in the through holes.

4. The package structure of claim 3, wherein the surface treatment layer is made of a material selected from the group consisting of electroplated nickel/gold, electroless nickel/gold, electroless nickel immersion gold (ENIG), electroless nickel electroless palladium immersion gold (ENEPIG), immersion tin, and organic solderability preservative (OSP).

5. A package structure having a semiconductor component embedded therein, comprising:
    a first dielectric layer having a first surface and a second surface opposing the first surface;
    a semiconductor chip embedded in the first dielectric layer in a manner that the semiconductor chip protrudes from the second surface of the first dielectric layer, and having an active surface and an inactive surface opposing the active surface, in which electrode pads are formed on the active surface and in the first dielectric layer, and the inactive surface and a part of a side surface adjacent the inactive surface protrude from the second surface of the first dielectric layer;
    a first circuit layer formed on the first surface of the first dielectric layer, with a plurality of first conductive vias formed in the first dielectric layer for electrically connecting to the first circuit layer to the electrode pads;

a built-up structure formed on the first surface of the first dielectric layer and the first circuit layer;

an insulating protective layer formed on the built-up structure, with a plurality of through holes formed in the insulating protective layer for exposing a part of a surface of the built-up structure;

a metal layer formed on the second surface of the first dielectric layer without being formed on the inactive surface of the semiconductor chip; and a carrier layer formed on the metal layer and the inactive surface of the semiconductor chip, wherein the carrier layer is in contact with the inactive surface of the semiconductor chip.

6. The package structure of claim 5, wherein the metal layer has an opening for the semiconductor chip to be received therewithin, such that the metal layer is used as a heat-dissipating component with respect to the semiconductor chip.

7. The package structure of claim 5, wherein the carrier layer is made of copper.

8. The package structure of claim 5, wherein the built-up structure comprises at least a second dielectric layer, a second circuit layer on the second dielectric layer, and a plurality of second conductive vias formed in the second dielectric layer for electrically connecting the first circuit layer to the second circuit layer, and a part of a surface of the second circuit layer is exposed from the through holes.

9. The package structure of claim 5, further comprising a surface treatment layer formed on the exposed part of the built-up structure in the through holes.

10. The package structure of claim 9, wherein the surface treatment layer is made of a material selected from the group consisting of electroplated nickel/gold, electroless nickel/gold, electroless nickel immersion gold (ENIG), electroless nickel electroless palladium immersion gold (ENEPIG), immersion tin, and organic solderability preservative (OSP).

* * * * *